United States Patent [19]

Bernet et al.

[11] 4,150,256
[45] Apr. 17, 1979

[54] DIGITAL MULTIPLEXER INCORPORATING HIGH-SPEED ANALOG SAMPLING GATES

[75] Inventors: Jean-Marie Bernet; Jean-Luc Pastre; Dominique Lamelot, all of Paris, France

[73] Assignee: Thomson-CSF, Paris, France

[21] Appl. No.: 837,571

[22] Filed: Sep. 28, 1977

[30] Foreign Application Priority Data

Oct. 1, 1976 [FR] France .............................. 76 29607

[51] Int. Cl.² .......................................... H04J 3/00
[52] U.S. Cl. ................................. 179/15 A; 307/257
[58] Field of Search ............................ 179/15 R, 15 A; 307/242, 243, 257, 321

[56] References Cited

U.S. PATENT DOCUMENTS

| 3,059,228 | 10/1962 | Beck | 179/15 A |
|---|---|---|---|
| 3,519,853 | 7/1970 | Fewell | 307/257 |
| 3,838,296 | 9/1974 | McLeod | 179/15 A |

Primary Examiner—Kathleen H. Claffy
Assistant Examiner—Joseph A. Popek
Attorney, Agent, or Firm—Karl F. Ross

[57] ABSTRACT

Multiplexers and demultiplexers including sampling gates in the form of diode bridges are disclosed. Plural-input gates, each formed from two or more diode bridges with two adjoining arms in common, are utilized in a multiplexer designed to synthesize a multi-level output train from a number of binary input trains exceeding the number of gates.

13 Claims, 8 Drawing Figures

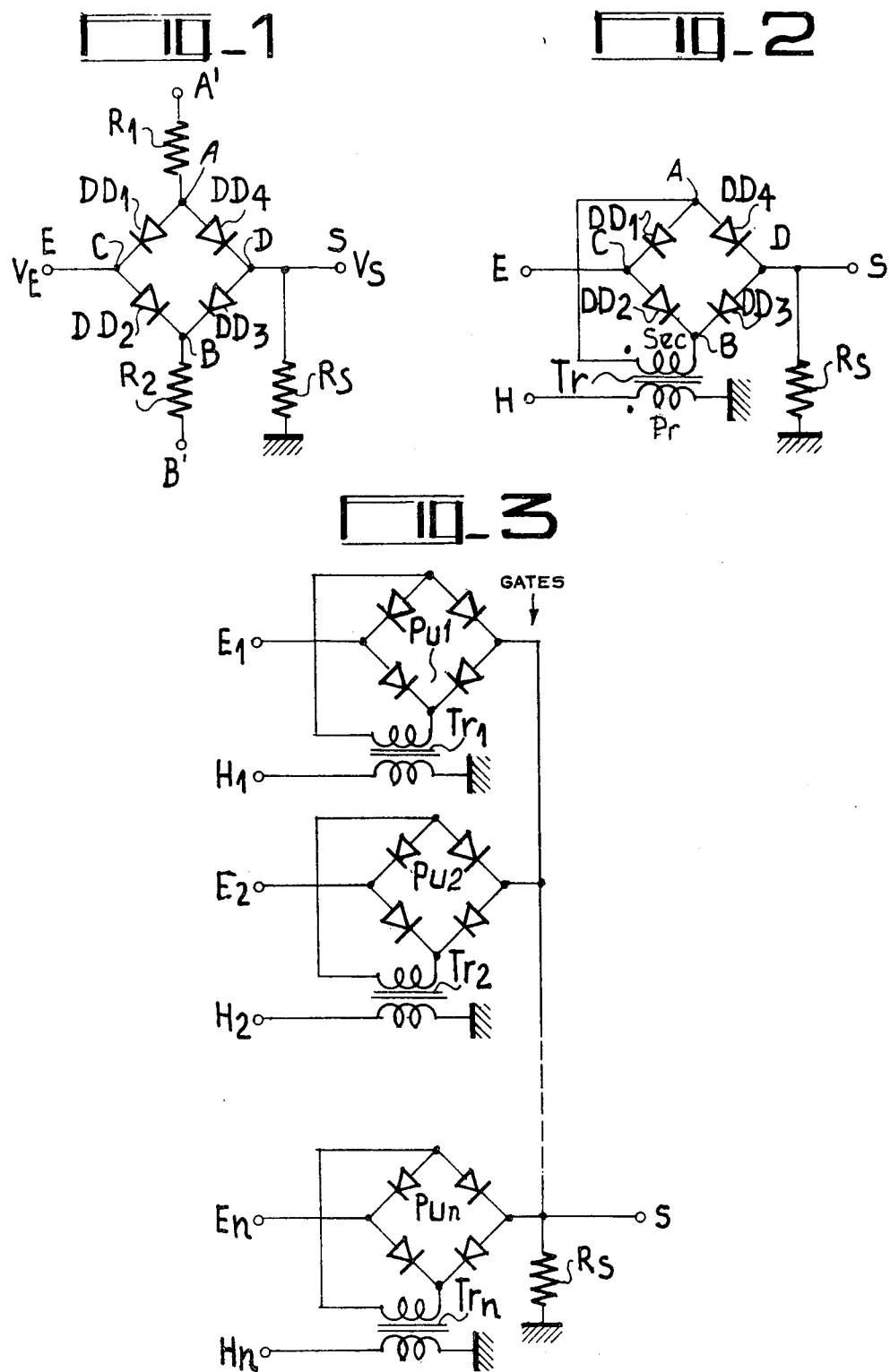

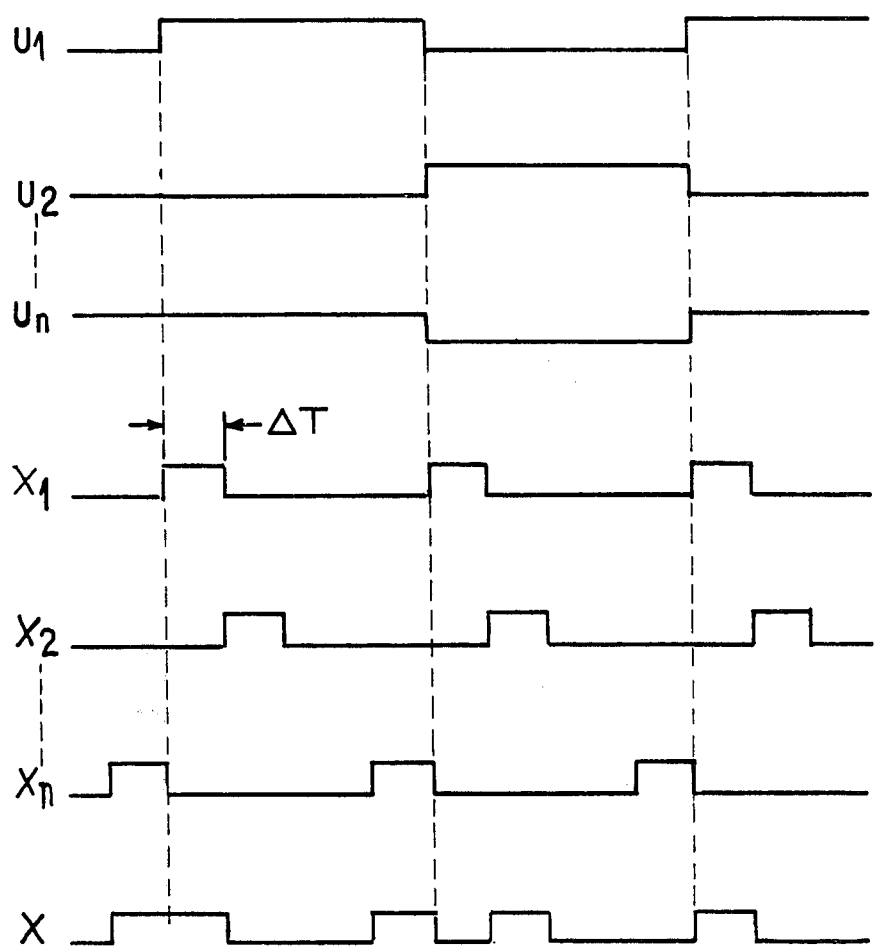
FIG_4

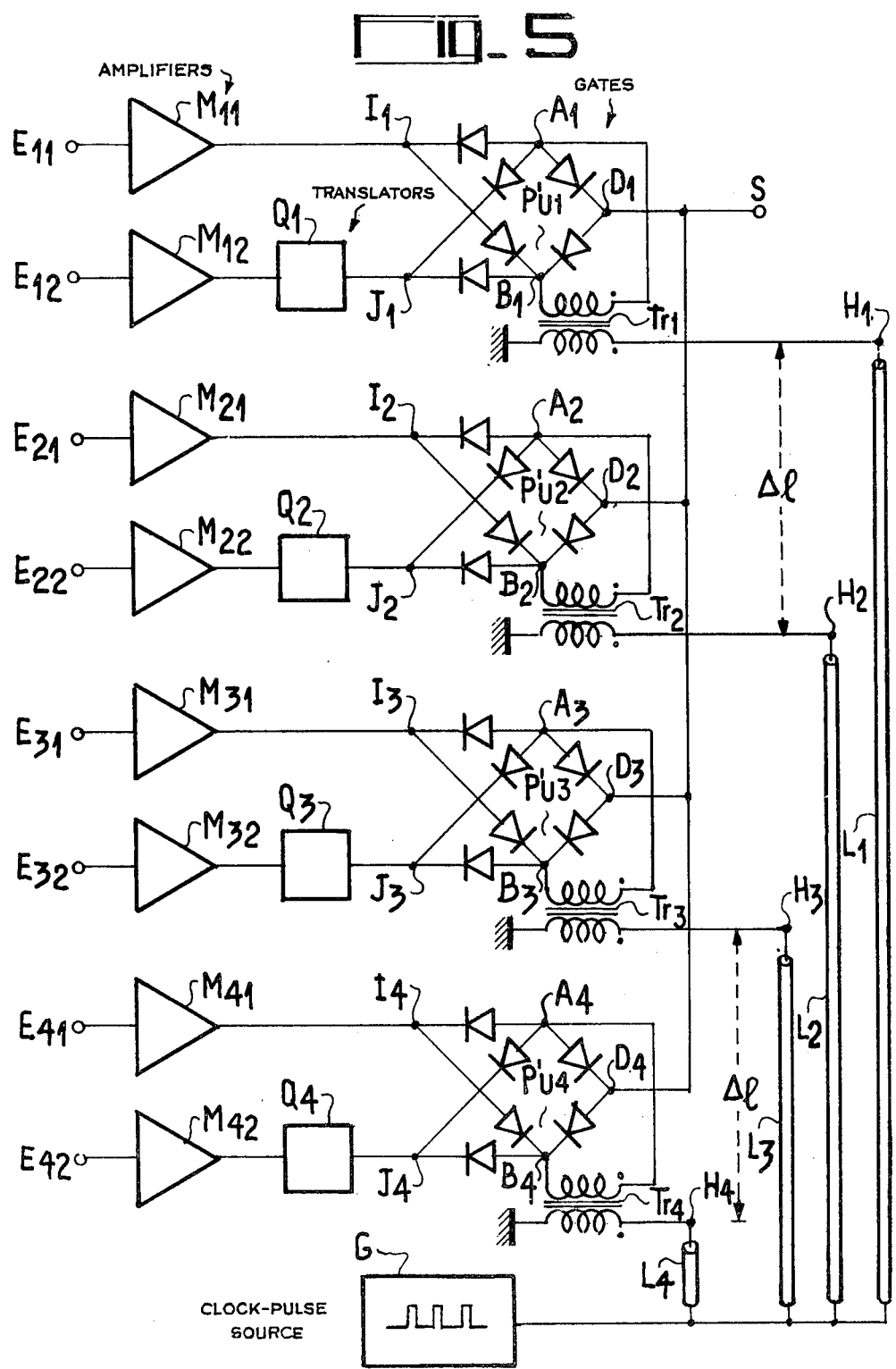

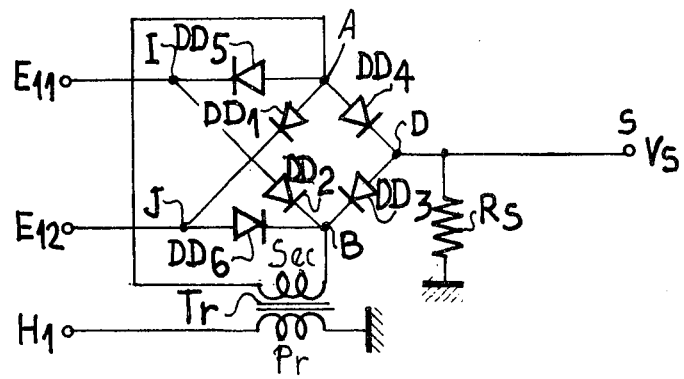
FIG_6
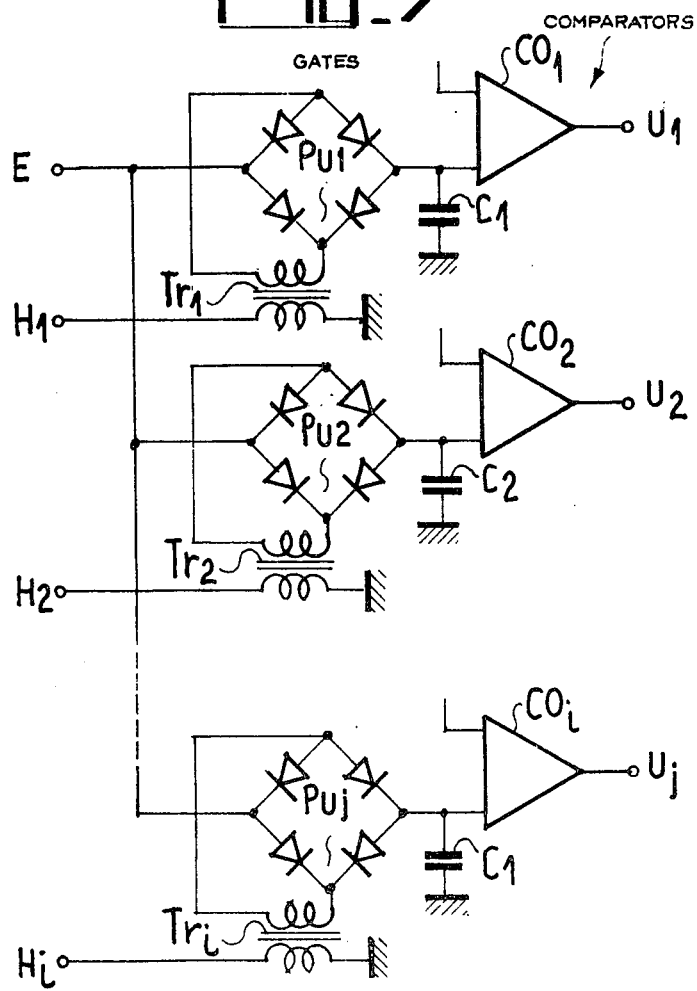
FIG_7

DIGITAL MULTIPLEXER INCORPORATING HIGH-SPEED ANALOG SAMPLING GATES

FIELD OF THE INVENTION

The present invention relates to a multiplexer for a digital data-processing system incorporating high-speed analog sampling gates.

BACKGROUND OF THE INVENTION

Multiplexing as generally defined, may be considered an operation which enables a plurality of individual items of information to be transmitted along the same transmission channel. The distribution of these items of information is performed as a function of a parameter which may be time, the frequency of the items of information, or their phase. In high-speed electronics, the field to wich the invention particularly relates, the controlling parameter is time. It may thus be assumed, by way of example, that in the case of digital information it is a question of performing the multiplexing operation on a certain number n of trains of binary logic signals $U_1, U_2, U_3, \ldots U_i, \ldots U_n$ of the same frequency F. Time multiplexing consists in transmitting over the selected single transmission channel, during respective time intervals $\Delta T$, each of the signals $U_1 - U_n$, $T = 1/F$ being the pulse period of the signal trains and n their number. The time $\Delta T$ during which a signal is transmitted may be written $\Delta T = T/n = 1/nF$.

It is convenient to represent the train of signals resulting from the multiplexing operation in the form of a logic equation, $X = U_1 X_1 + U_2 X_2 + \ldots + U_i X_i + \ldots + U_n X_n$, in which the parameters $X_1$ to $X_n$ represent periodic logic signals which are of the value 1 during time $\Delta T$ and which are relatively staggered by the same interval $\Delta T$.

The multiplexing operation referred to above is known and conventionally performed by logical circuitry in a so-called pulse-code-modulation or PCM system.

The logic circuits which are used to perform the multiplexing function, generally designed as gates, operate at a clock frequency which is the product nF of the number n of signal trains involved times the frequency F. The result is that the arithmetic throughput on the single transmission channel involved is limited by the maximum operating frequency of the logic circuits.

To increase this operating frequency, high-speed analog gates have been used in such processing systems; in an article published in *Wissenschafliche Berichte-AEG Telefunken*, vol. 48, 1975, No. 2/3, Berlin, a multiplexer is described for the processing of four trains of signals, incorporating switching gates consisting of two diodes each.

OBJECT OF THE INVENTION

The object of our present invention is to provide an improved multiplexer synthesizing, from interleaved samples of a multiplicity of binary pulse trains of like frequency and coincident pulse periods, a composite pulse train whose frequency is less than the frequency of the constituent binary trains multiplied by the number of these latter trains.

SUMMARY OF THE INVENTION

We realize this object, in accordance with our present invention, by providing a plurality of sampling gates each consisting of six or more diodes which define a plurality of four-arm bridge circuits having two adjoining arms in common. Each bridge circuit has a pair of noncommon arms interconnected at a first junction representing (or tied to) an input terminal to which an incoming binary pulse train is fed from a respective source. The common arms of the bridge circuits forming the sampling gate are interconnected at a second junction while their common and noncommon arms are interconnected at third and fourth junctions. The second junctions of all sampling gates of the multiplexer are connected to a common output terminal while a supply of switching voltages is connected across the third and fourth junctions of each sampling gate for successively unblocking the several gates at staggered intervals in the course of a pulse period. As a result, the common output terminal carries a multi-level pulse train whose pulse amplitudes are proportional to the algebraic sums of binary voltages that are concurrently present on the first junctions or input terminals of any sampling gate.

In order to make these algebraic sums different for all possible combinations of binary voltages applied to a sampling gate, we further prefer to insert voltage-modifying means between the sources of binary pulse trains and the corresponding input terminals. With the aid of such voltage-modifying means, including polarity inverters, the binary voltages applied to the input of each bridge circuit of a two-input gate can be given opposite polarities and substantially identical absolute magnitudes, these magnitudes being different for the two bridge circuits of such a gate. As will become apparent hereinafter, the algebraic sum appearing at the second junction or output lead of the sampling gate will then be one of four distinct numerical values; the resulting quaternary pulse train can be readily demultiplexed with the aid of corresponding comparators.

BRIEF DESCRIPTION OF THE DRAWING

The above and other features of the invention will now be described in detail with reference to the accompanying drawing in which:

FIG. 1 shows a single-input ultra-high-speed analog gate;

FIG. 2 shows the gate of FIG. 1 together with changeover means therefor;

FIG. 3 shows a multiplexing system incorporating several gates of the type shown in FIGS. 1 and 2;

FIG. 4 is a pulse diagram showing signal trains fed to and emitted by the multiplexing system of FIG. 3;

FIG. 5 shows a multi-level multiplexing system according to our invention;

FIG. 6 shows a two-input ultra-high-speed analog gate used in the system of FIG. 5;

FIG. 7 shows a demultiplexing system similar to the multiplexing system of FIG. 3.

SPECIFIC DESCRIPTION

Figure 8:
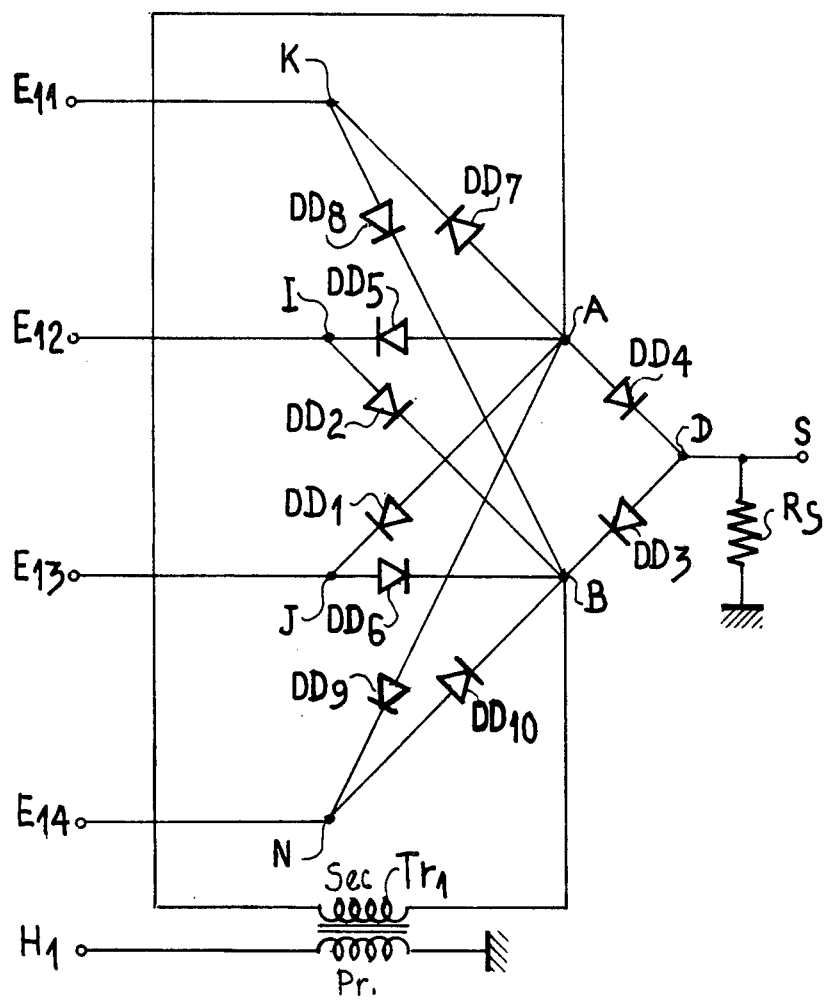
FIG. 8 shows a four-input ultra-high-speed analog gate.

As indicated above, our present invention is applicable in particular to high-speed digital data-processing systems in which the use of integrated logic circuits limits the operating frequency of the systems and consequently restricts their speed. This restriction is particularly apparent in multiplexing and demultiplexing systems where an operating frequency of the order of gigahertz cannot be achieved with logic gates.

To overcome this disadvantage, we use analog gate circuits for sampling which are chiefly formed by ultra-fast switching diodes, e.g. those known as hot-carrier diodes.

FIG. 1 shows such a high-speed analog gate provided with one input.

Four diodes $DD_1$, $DD_2$, $DD_3$, $DD_4$ are arranged in a bridge circuit whose corners are designated A, B, C, D. Corner C is connected to a terminal E to which input signals are applied in the form of a voltage $V_E$. Corner D is connected to a terminal S at which an output signal appears in the form of a voltage $V_S$ proportional to the input voltage $V_E$. The corners A and B are connected via respective resistors $R_1$, $R_2$ of the same magnitude to terminals A' and B' to which are applied operating voltages of value $\pm V$. A load resistor $R_S$ is connected to the output terminal S.

Such a gate operates as follows: If, for example, a negative voltage $-V$ is applied to point A' and if a positive voltage $+V$ of the same absolute value is applied to point B' with $-V < V_E < +V$, the diodes $DD_1$ to $DD_4$ are reverse biased and blocked. The output voltage at point S is zero.

If, on the other hand, a positive voltage $+V$ is applied to terminal A' and a negative voltage $-V$ of the same absolute value is applied to terminal B', the diodes $DD_1$ to $DD_4$ conduct and a voltage $V_S$ proportional to the voltage $V_E$ applied to the input E is obtained at output S.

FIG. 2 shows an ultra-high-speed analog gate similar to that of FIG. 1 but provided with control means for applying to points A and B voltages similar to the voltages $\pm V$ referred to above.

The control means consists of a transformer Tr whose primary winding Pr is connected to a terminal H to which clock pulses are applied, these pulses being positive in the present instance. The secondary winding Sec of this transformer is connected across the corners B and A to energize them with gate-switching voltages.

The simultaneous application of positive signals, for example, to terminals E and H causes the gate to perform a logic function $S_i = X_i \cdot U_i$ where $X_i$ is a clock pulse and $U_i$ is a digital signal to be processed.

FIG. 3 is a schematic representation of a multiplexing arrangement which employs single-input ultra-high-speed analog sampling gates as shown in FIG. 2.

The system shown in this Figure comprises analog gates $P_{U1}$ to $P_{Un}$ equal in number to the aforementioned digital signal trains $U_1 - U_n$.

All the gates $P_{U1}$ to $P_{Un}$ are connected in parallel and have a common output S. Their inputs $E_1$ to $E_n$ on the other hand, are separate, as are also the control terminals $H_1$ to $H_n$ to which are applied the switching clock signals $X_1$ to $X_n$ shown in FIG. 4.

FIG. 4 also shows waveforms representing the various trains of digital logic signals $U_1$ to $U_n$ of common frequency F which the multiplexing system of FIG. 3 is to transmit along the same transmission channel.

The clock pulses $X_1$ to $X_n$ shown in FIG. 4 have a duration $\Delta T$ representing the transmission period for each sample selected from the arriving logic signals $U_1$ to $U_n$ to be transmitted. Successive clock pulses generally designated $X_i$, $X_{i+1}$ are relatively staggered by an interval $\Delta T$ so that the various gates are sequentially unblocked for respective periods $\Delta T$ during which they transmit the samples of the corresponding signals. The various samples are developed across the load resistor $R_S$ and are emitted in the form of a single pulse train X with pulse amplitudes proportional to the input voltages applied to the respective terminals $E_1$ to $E_n$ of the various gates.

FIG. 3 does not show any means for controlling the distribution of the switching pulses to the analog gates $P_{U1} - P_{Un}$.

In FIG. 5 which represents a multiplexing system according to our invention emitting a multi-level pulse train, we have illustrated such means for distributing the switching-control signals is shown.

The operating frequency of the logic system is high, of the order of at least a gigahertz in the case here considered; the various control pulses are obtained from a pulse generator G of frequency F and pulse width $\Delta T = 1/nF$. In the four-stage system of FIG. 5, $n=4$.

The terminals $H_1$ to $H_4$, to which the switching pulses are to be applied in cyclic succession, are connected to the generator G by respective delay lines $L_1$ to $L_4$ which may be coaxial cables differing from one another by a length $\Delta l$ corresponding to a time difference equal to $\Delta T$ so that $\Delta T = \Delta l / c$ (or $\Delta l = c/nF$), where c is the speed of propagation of the electrical signals in the cables.

The relationship between the various cable lengths is thus as follows:

$$L_2 = L_1 - \Delta l$$

$$L_3 = L_2 - \Delta l$$

$$L_n = L_{n-1} - \Delta l$$

The multiplexer of FIg. 5 uses two-input high-speed analog gates, more fully described hereinafter with reference to FIG. 6, to synthesize a multi-level outgoing pulse train from a multiplicity of binary incoming pulse trains. This outgoing pulse train has a lower frequency than would be obtained otherwise. In fact, if its pulse frequency exceeded several gigahertz, for example, the single transmission channel would be incapable of transmitting it.

FIG. 6 shows a high-speed analog gate having two inputs. It consists of six ultra-fast switching diodes $DD_1$ to $DD_6$ which are so connected to inputs $E_{11}$ and $E_{12}$ as to define two bridges with respective corners A-I-B-D and A-J-B-D which are formed by diodes $DD_5$, $DD_2$, $DD_3$, $DD_4$ and $DD_1$, $DD_6$, $DD_3$, $DD_4$. The input $H_1$ for the switching-control pulse is tied, as in FIGS. 2 and 3, to the primary winding Pr of transformer Tr whose secondary winding Sec is connected across the corners A and B of the gate in question. The arms $DD_3$, $DD_4$ common to the two bridges are interconnected at the corner D which is tied to the output terminal S and to load resistor $R_S$. Each bridge circuit has a pair of non-common arms $DD_1$, $DD_5$ and $DD_2$, $DD_6$ whose junctions I and J are tied to respective input terminals $E_{11}$, $E_{12}$.

The operation of such a dual gate is in essence similar to that of a simple gate as shown in FIG. 1 or 2. When a positive clock pulse is applied to the common corner A of the two constituent bridge circuits formed by diodes $DD_1 - DD_6$, these circuits conduct and the portions of the signals which are present at inputs $E_{11}$ and $E_{12}$ during the open period $\Delta T$ are transmitted to output S with their amplitudes additively confined. In fact, calculation will show that the voltage which appears at output S of the two-input gate concerned is proportional to the mean value of the voltages of the signals applied to the input terminals $E_{11}$ and $E_{12}$ of the gate, i.e. $V_S = k(V_{E11} + V_{E12})$.

It is clear that the use of several such plural-input analog gates makes it possible to transmit 2n binary signal trains in the form of one multiplexed multi-level digital train. With incoming signals having pulse amplitudes suitably chosen from among voltage levels 0, $-1$, $+1$, $-2$, $+2$, a four-level composite train may be obtained.

By way of example, the system in FIG. 5 may be designed for the high-speed multiplexing of eight trains of binary signals whose frequency is of the order of 150 MHz. It emits at its outputs a quaternary digital signal at a frequency of the order of 600 MHz. If processed by the system of FIG. 3, the frequency would have been of the order of 1,200 MHz.

In the embodiment of FIG. 5 the multiplexer includes four high-speed analog gates $P'_{U1}$ to $P'_{U4}$ each having two inputs, i.e $E_{11}$ and $E_{12}$, $E_{21}$ and $E_{22}$, $E_{31}$ and $E_{32}$, $E_{41}$ and $E_{42}$.

The opening of these gates is controlled by circuitry comprising transformers $Tr_1$ to $Tr_4$ whose primary windings are connected by the delay lines $L_1$ to $L_4$ to the clock-pulse generator G which operates at a frequency F of 150 MHz in the example selected. The difference $\Delta l$ is the length of two successive delay lines is such that the transit times through the lines differ by a quarter of a clock-pulse period, i.e. by an interval $\Delta T = T/n$. Thus, the four gates $P'_{U1}$ to $P'_{U4}$ are each opened for a quarter of a pulse period in cyclic succession.

These gates have their common output S connected in parallel to the respective corners $D_1$, $D_2$, $D_3$ and $D_4$. The two inputs of each gate receive the binary signal trains which are to be multiplexed by forming the algebraic sum of the samples passed by the gates.

In order that this operation may properly proceed, conditions, amplifiers $M_{11}$, $M_{12}$, $M_{21}$, $M_{22}$, $M_{31}$, $M_{32}$, $M_{41}$, $M_{42}$ have been inserted in the input lead of each constituent diode bridge and one of these input leads further includes a translator $Q_1$ to $Q_4$ in series with the corresponding amplifier. This translator, which may be a simple Zener diode provided with a resistor between its anode and a source of reference voltage, serves to transform the logic levels of the incoming signals so that the respective gates are able to perform an arithmetic addition of the binary signal levels from two separate incoming trains without any loss of information due to cancellation of signals. Thus, for example, amplifier $M_{11}$ transposes the logic levels received at its input $E_{11}$, assumed to be of negative polarity, logic levels. Amplifier $M_{12}$, on the other hand, which is followed by translator $Q_1$, performs a transposition to negative logic levels.

Depending upon the voltage levels allocated to the logic levels 0 and 1 of the binary input signals, there may be obtained from the output S of the arrangement of FIG. 5 a single pulse train on four levels. Thus, for example, voltage levels of $-1V$, $+1V$ for one incoming train and $-2V$, $+2V$ for the other incoming train yields levels of $-3$, $-1$, $+1$ and $+3$ for the output train.

FIG. 7 shows a demultiplexing system which employs the high-speed analog gates described above with reference to the multiplexing system of FIG. 3. These gates $P_{U1}$, $P_{U2}$, ... $P_{Ui}$ are connected in parallel to their common input E to which a single train of signals demultiplexed is applied. Control inputs $H_1$ to $H_i$ receive the clock pulses via transformers $Tr_1$ to $Tr_i$.

The gates $P_{U1}$ to $P_{Ui}$ have separate outputs each including a comparison circuit $CO_1$, $CO_2$, ... $CO_i$ which reconstitutes the respective logic signal $U_1$, $U_2$, ... $U_i$.

In cases where the train of signals to be demultiplexed is of the multi-level type referred to above, the output of each single-input gate is connected to a number of comparators equal to the number of levels involved.

Our invention is not restricted to gates having two inputs. Depending upon the number of levels required, it is possible to envisage the use of gates having three or four inputs which enable signals to be multiplexed on six or eight levels.

By way of example, FIG. 8 shows a high-speed analog gate with four inputs. It has the advantage of involving a relatively small number of high-speed unidirectional elements but calls for a substantial increase in the power of the clock-pulse generator with the result that, in the context of present-day technology, the theoretically unrestricted number of inputs for a gate is limited in practice.

The four inputs $E_{11}$, $E_{12}$, $E_{13}$, $E_{14}$ of FIG. 8 are tied to respective junctions K, I, J, N of bridge arms $DD_7$ and $DD_8$, $DD_2$ and $DD_5$, $DD_1$ and $DD_6$, $DD_9$ and $DD_{10}$ defining four gates which are selectively unblocked during the multiplexing operations, namely K-A-D-B, I-A-D-B, J-A-D-B and N-A-D-B all having the adjoining arms $DD_3$, $DD_4$ and their corners A, B and D in common.

As in the case of the other gates, the clock pulses applied to control input $H_1$ are transmitted by a transformer $Tr_1$.

The operation of such a gate is similar to that of the above-described gates having one and two inputs.

What is claimed is:

1. In a digital data-processing system including a multiplicity of sources of binary pulse trains of like frequency and coincident pulse periods, and a multiplexer operable to sample said binary pulse trains in cyclic succession and to synthesize a composite pulse train from the resulting samples, the improvement wherein said multiplexer comprises:

a plurality of sampling gates each consisting of at least six diodes defining a plurality of four-arm bridge circuits with two adjoining arms in common, each of said bridge circuits having a pair of noncommon arms interconnected at a first junction, said common arms being interconnected at a second junction, said common and noncommon arms being interconnected at third and fourth junctions, each of said sources being connected to the first junction of a respective bridge circuit, the second junctions of all sampling gates being connected to a common output terminal; and a supply of switching voltages connected across the third and fourth junctions of each sampling gate for successively unblocking said sampling gates at staggered intervals in the course of a pulse period, thereby producing on said output terminal a multi-level pulse train with pulse amplitudes proportional to the algebraic sums of binary voltages concurrently present on the first junctions of any of said sampling gates.

2. The improvement defined in claim 1, further comprising voltage-modifying means inserted between said sources and the first junctions respectively connected thereto for making said algebraic sums different for all possible combinations of binary voltages applied to any of said sampling gates.

3. The improvement defined in claim 2 wherein each sampling gate consists of two bridge circuits.

4. The improvement defined in claim 3 wherein said voltage-modifying means comprises a polarity inverter connected to the first junction of one of the bridge cicuits of each sampling gate.

5. The improvement defined in claim 3 wherein the binary voltages applied by said voltage-modifying means to the first junction of each bridge circuit are of opposite polarities and substantially identical absolute magnitudes, said absolute magnitudes being different for the two bridge circuits of any sampling gate.

6. The improvement defined in claim 5 wherein said absolute magnitudes are in a ratio of substantially 2:1 for said two bridge circuits.

7. The improvement defined in claim 1 wherein said supply comprises a clock-pulse generator with an operating frequency F equal to the frequency of said binary pulse trains and with a pulse width equal to $1/nF$ where n is the number of said sampling gates, said generator being connected to said sampling gates via respective delay lines differing in length by distances equal to $c/nF$ where c is the propagation velocity of the clock pulses in said delay lines.

8. In a digital data-processing system, in combination:
   a sampling gate of at least six diodes defining a plurality of four-arm bridge circuits with two adjoining arms in common, each of said bridge circuits having a pair of noncommon arms interconnected at a first junction, said common arms being interconnected at a second junction, said common and noncommon arms being interconnected at third and fourth junctions;
   a plurality of sources of binary pulse trains of like frequency and coincident pulse periods, each of said sources being connected to the first junction of a respective bridge circuit; and
   a supply of switching voltages connected across said third and fourth junctions for unblocking same during a fraction of a pulse period, thereby producing on said second junction a multi-level pulse train with pulse amplitudes proportional to the algebraic sums of binary voltages concurrently present on the first junctions of said bridge circuits.

9. The combination defined in claim 8, further comprising voltage-modifying means inserted between said sources and said first junctions for making said algebraic sums different for all possible combinations of said binary voltages.

10. The combination defined in claim 9 wherein said sampling gate consists of two bridge circuits.

11. The combination defined in claim 10 wherein said voltage-modifying means comprises a polarity inverter connected to the first junction of one of said bridge circuits.

12. The combination defined in claim 10 wherein the binary voltages applied by said voltage-modifying means to the first junction of each bridge circuit are of opposite polarities and substantially identical absolute magnitudes, said absolute magnitudes being different for said two bridge circuits.

13. The combination defined in claim 12 wherein said absolute magnitudes are in a ratio of substantially 2:1 for said two bridge circuits.

* * * * *